United States Patent
Park et al.

(10) Patent No.: US 11,320,732 B2
(45) Date of Patent: May 3, 2022

(54) METHOD OF MEASURING CRITICAL DIMENSION OF A THREE-DIMENSIONAL STRUCTURE AND APPARATUS FOR MEASURING THE SAME

(71) Applicants: SK hynix Inc., Icheon (KR); IUCF-HYU (Industry-University Cooperation Foundation Hanyang University), Seoul (KR)

(72) Inventors: Chuljin Park, Seoul (KR); Hyungjin Kim, Seoul (KR)

(73) Assignees: SK hynix Inc, Icheon (KR); IUCF-HYU (Industry-University Cooperation Foundation Hanyang University), Seoul (KR)

( * ) Notice: Subject to any disclaimer, the term of this patent is extended or adjusted under 35 U.S.C. 154(b) by 0 days.

(21) Appl. No.: 17/206,654

(22) Filed: Mar. 19, 2021

(65) Prior Publication Data
US 2021/0294204 A1 Sep. 23, 2021

(30) Foreign Application Priority Data
Mar. 19, 2020 (KR) .................. 10-2020-0033894

(51) Int. Cl.
G03F 1/36 (2012.01)
G03F 7/20 (2006.01)
G06F 30/398 (2020.01)

(52) U.S. Cl.
CPC ............ *G03F 1/36* (2013.01); *G03F 7/70625* (2013.01); *G03F 7/70683* (2013.01); *G06F 30/398* (2020.01)

(58) Field of Classification Search
CPC .... G03F 1/36; G03F 7/70625; G03F 7/70683; G03F 7/70616; G06F 30/398; G06F 17/16; G01B 9/02007
See application file for complete search history.

(56) References Cited

U.S. PATENT DOCUMENTS 6,476,920 B1 11/2002 Scheiner et al.
6,720,568 B2 * 4/2004 Finarov ................ G01N 21/956
250/559.45

(Continued)

FOREIGN PATENT DOCUMENTS

KR 102020021 B1 9/2019

*Primary Examiner* — Stacy Whitmore

(57) ABSTRACT

A method of measuring a critical dimension comprises determining matrix information on a hypothesized parameter distribution on the critical dimension; obtaining a measurement spectrum for each wavelength of a light reflected from the three-dimensional structure; sampling a first candidate parameter vector for determining a numerical simulation spectrum that approximates the measurement spectrum; linearly transforming the first candidate parameter vector by using the matrix information; determining a first candidate parameter which minimizes a difference between the measurement spectrum and the numerical simulation spectrum within the linearly transformed first candidate parameter vector; determining a second candidate parameter vector derived from the first candidate parameter and having the hypothesized parameter distribution by using a heuristic algorithm; determining a second candidate parameter that minimizes a difference between the measurement spectrum and the numerical simulation spectrum within the second candidate parameter vector; and updating the first candidate parameter by using the second candidate parameter.

20 Claims, 6 Drawing Sheets

(56) References Cited

U.S. PATENT DOCUMENTS

| | | | |
|---|---|---|---|
| 9,766,552 B2* | 9/2017 | Van Beurden | ...... G03F 7/70625 |
| 2011/0098992 A1* | 4/2011 | Van Beurden | ...... G03F 7/70625 |
| | | | 703/2 |

* cited by examiner original coordinate system         transformed coordinate system

METHOD OF MEASURING CRITICAL DIMENSION OF A THREE-DIMENSIONAL STRUCTURE AND APPARATUS FOR MEASURING THE SAME

CROSS-REFERENCES TO RELATED APPLICATION

The present application claims the benefit of Korean patent application number 10-2020-0033894, filed on Mar. 19, 2020, which is herein incorporated by reference in its entirety.

BACKGROUND OF THE DISCLOSURE

1. Field

The present disclosure relates to an electronic device fabrication technology, and more particularly, to a method of measuring a critical dimension of a three-dimensional structure constituting a device and apparatus for measuring the same.

2. Description of the Related Art

In the process of fabricating an electronic device, for example, a semiconductor device such as a transistor, a memory device, or a processor, a critical dimension (CD) of three-dimensional shape (or a three-dimensional structure) of the electronic device may be measured in order to confirm the geometric size of the three-dimensional shape that affects the electrical or physical performance of the semiconductor device, for example, a line width, a thickness, a height, or an aspect ratio. In addition, the CD may be measured in order to detect a defect in the semiconductor device or to analyze the type of the defect.

A critical dimension may be changed during various processes for fabricating semiconductor device, and the changes of the CD has a significant influence on product yield and performance of the semiconductor device, and thus, a technique for accurately measuring the critical dimension and managing efficiently the critical dimension may be desirable. In particular, as the integration density of the semiconductor devices is increased, it is desirable to quickly measure the CD to ensure efficiency. Conventionally, a scanning electron microscope (SEM) measuring method and an optical critical dimension measuring method have been utilized. Since the optical critical dimension measuring method may increase a throughput compared to the SEM measuring method, and may accurately and efficiently measure the CD, the optical critical dimension measuring method is used more frequently than the SEM measuring method.

Specifically, the optical critical dimension measuring method estimates the CD through a parameter vector that minimizes the difference between the simulated spectrum and the measured spectrum, and searching the parameter vector may be performed through a process for solving a nonlinear parameter estimation problem. In this case, a parameter vector corresponding to the measurement spectrum may be found from a data set corresponding to a set of all possible parameter vectors.

However, in estimating the nonlinear parameter, an undesired result may be caused by an estimation error, so that a gradient vector estimation or a Hessian matrix estimation may be required to be performed on each candidate solution. Therefore, such a conventional estimation method for the nonlinear parameter becomes sensitive to the characteristics of the objective function that determines the parameter vector, and it becomes more likely to obtain an incorrect parameter vector. Moreover, as the size of the semiconductor device such as a highly integrated circuit IC is reduced to a relatively small scale (e.g., a nano scale), it may become more difficult and inaccurate to estimate the parameter vector based on a conventional numerical simulator.

Therefore, an improved method that accurately and quickly calculate and estimate the parameter vector capable of modeling a measured spectrum may be desirable.

SUMMARY OF THE DISCLOSURE

An aspect of embodiments of the present disclosure is to provide methods of measuring a critical dimension of a three-dimensional shape by accurately and quickly calculating a parameter vector capable of modeling a measurement spectrum and then estimating the critical dimension of the three-dimensional shape.

In addition, another aspect of embodiments of the present disclosure is to provide apparatuses for measuring a critical dimension having the aforementioned advantages.

However, the aspects of embodiments of the present disclosure are not limited to thereto, and embodiments of the present disclosure may have other various aspects.

According to an embodiment of the present disclosure, a method of measuring a critical dimension may comprise determining matrix information on a hypothesized parameter distribution on the critical dimension; obtaining a measurement spectrum for each wavelength of a light reflected from the three-dimensional structure; sampling a first candidate parameter vector for determining a numerical simulation spectrum that approximates the measurement spectrum; linearly transforming the first candidate parameter vector by using the matrix information; determining a first candidate parameter which minimizes a difference between the measurement spectrum and the numerical simulation spectrum within the linearly transformed first candidate parameter vector; determining a second candidate parameter vector derived from the first candidate parameter and having the hypothesized parameter distribution by using a heuristic algorithm; determining a second candidate parameter that minimizes a difference between the measurement spectrum and the numerical simulation spectrum within the second candidate parameter vector; and updating the first candidate parameter by using the second candidate parameter. The matrix information may include a mean vector and a covariance matrix of the hypothesized parameter distribution, and the determining the matrix information may include decomposing the covariance matrix to a product of a lower triangular matrix, and a transpose matrix of the lower triangular matrix.

In an embodiment, the linearly transforming the first candidate parameter vector may include multiplying the first candidate parameter vector by the lower triangular matrix to output a first output vector; and adding the first output vector and the mean vector to output a second output vector. The determining the second candidate parameter may include linearly transforming the second candidate parameter vector by using the matrix information. The linearly transforming the second candidate parameter vector may include multiplying the second candidate parameter vector by a lower triangular matrix to output a first output vector, the lower triangular matrix being obtained by decomposing a covariance matrix of the matrix information; and adding the first output vector and a mean vector of the matrix information to output a second output vector.

In an embodiment, the determining the second candidate parameter vector may include selecting a third candidate parameter vector that satisfies the following equation.

$$R \le \max\left\{\frac{\prod_{m=1}^{p} h(\tilde{\theta}_m^c)}{(h(0))^p}, \phi\right\},$$

Here, R is a uniform random number having an independent and identical distribution (i.i.d) between 0 and 1, h(x) is a probability density function of a standard normal distribution, p is a size of the second candidate parameter vector, and $\tilde{\theta}_m^c$ is the second candidate parameter derived from the first candidate parameter, and φ is a user-specified value between 0 and 1.

In an embodiment, the determining obtaining the measurement spectrum, sampling the first candidate parameter vector, linearly transforming the first candidate parameter vector, determining the first candidate parameter, determining the second candidate parameter vector, determining the second candidate parameter, and updating the first candidate parameter are repeatedly performed by batch units for the three-dimensional structure constituting the device. The hypothesized parameter distribution may be probabilistic statistics data of a plurality of parameters obtained by repeatedly performing by the batch unit, and includes a multivariate normal distribution. Each parameter in the first candidate parameter vector or the second candidate parameter vector has an average of 0 and a variance of 1 in a linearly transformed coordinate system, and may have statistically independent characteristics.

In one embodiment, the heuristic algorithm may include any one of GA (Genetic Algorithm), SA (Simulated Annealing), PSO (Partial Swarm Optimization), EA (evolutionary algorithms), TS (Tabu Search) and ACO (Ant Colony Optimization).

According to another embodiment of the present disclosure, an apparatus for measuring critical dimension comprising a library unit configured to determine matrix information on a hypothesized parameter distribution regarding a critical dimension of a 3D structure constituting the device; a spectrum input unit for obtaining a measurement spectrum for each wavelength of a light reflected from the three-dimensional structure; and a controller wherein a first candidate parameter vector for determining a numerical simulation spectrum adjacent to the measurement spectrum is sampled, the first candidate parameter vector is linearly transformed by using the matrix information, a first candidate parameter that minimizes a difference between the measurement spectrum and the numerical simulation spectrum within the linearly transformed first candidate parameter vector is determined, a second candidate parameter vector derived from the first candidate parameter and having the hypothesized parameter distribution is determined by using a heuristic algorithm, a second candidate parameter which minimizes a difference between the measurement spectrum and a numerical simulation spectrum within the second candidate parameter vector is determined, and the first candidate parameter is updated by using the second candidate parameter may be provided. The matrix information includes a mean vector and a covariance matrix of the hypothesized parameter distribution, and in the controller, the step for determining the matrix information may decompose the covariance matrix into a product of a lower triangular matrix and the transpose matrix of the lower triangular matrix.

In an embodiment, the controller may output a first output vector by multiplying the first candidate parameter vector by the lower triangular matrix, and output a second output vector by adding the first output vector and the mean vector. The controller unit may linearly transform the second candidate parameter vector by using the matrix information. The controller unit may output a first output vector by multiplying the second candidate parameter vector by a lower triangular matrix decomposed from the covariance matrix of the matrix information, and output a second output vector by adding the first output vector and the mean vector of the matrix information.

In an embodiment, the controller unit may probabilistically select a candidate parameter vector that satisfies the following equation.

$$R \le \max\left\{\frac{\prod_{m=1}^{p} h(\tilde{\theta}_m^c)}{(h(0))^p}, \phi\right\},$$

Here, R is a uniform random number having an independent and identical distribution (i.i.d) between 0 and 1, h(x) is a probability density function of the standard normal distribution, p is the size of the second candidate parameter vector, and $\tilde{\theta}_m^c$ is the second candidate parameter derived from the first candidate parameter, and φ is a user-specified value between 0 and 1.

In an embodiment, the controller unit may inversely and linearly transform the first candidate parameter. The controller unit may update the matrix information by using the measurement spectrum. The controller unit controls one 3D structure constituting the element to be repeatedly performed by batch units. The hypothesized parameter distribution is probabilistic statistical data of a plurality of parameters obtained by repeatedly performing the batch unit, and may include a multivariate normal distribution.

In an embodiment, each parameter in the first candidate parameter vector or the second candidate parameter vector has an average of 0 and a variance of 1 in a linearly transformed coordinate system, and may have statistically independent characteristics.

According to an embodiment of the method of measuring the critical dimension of a three-dimensional shape of the present disclosure, There is an advantage that a step for linearly transforming the candidate parameter vector, and a step for filtering the candidate parameter vector may be performed by using matrix information on the hypothesized parameter distribution regarding the critical dimension of the three-dimensional structure constituting the electronic device, and thus, it is possible to accurately and quickly calculate and estimate parameter vectors that may model the measurement spectrum.

Further, according to an embodiment of an apparatus for measuring a critical dimension of a three-dimensional shape of the present disclosure, a measurement or calculation apparatus having the above-described advantages may be provided.

The effects of the present disclosure are not limited to the above-described effects, and those skilled in the art of the present disclosure may easily derive various effects of the present disclosure from the configuration of the present disclosure.

DETAILED DESCRIPTION OF THE DISCLOSURE

Figure 1A:
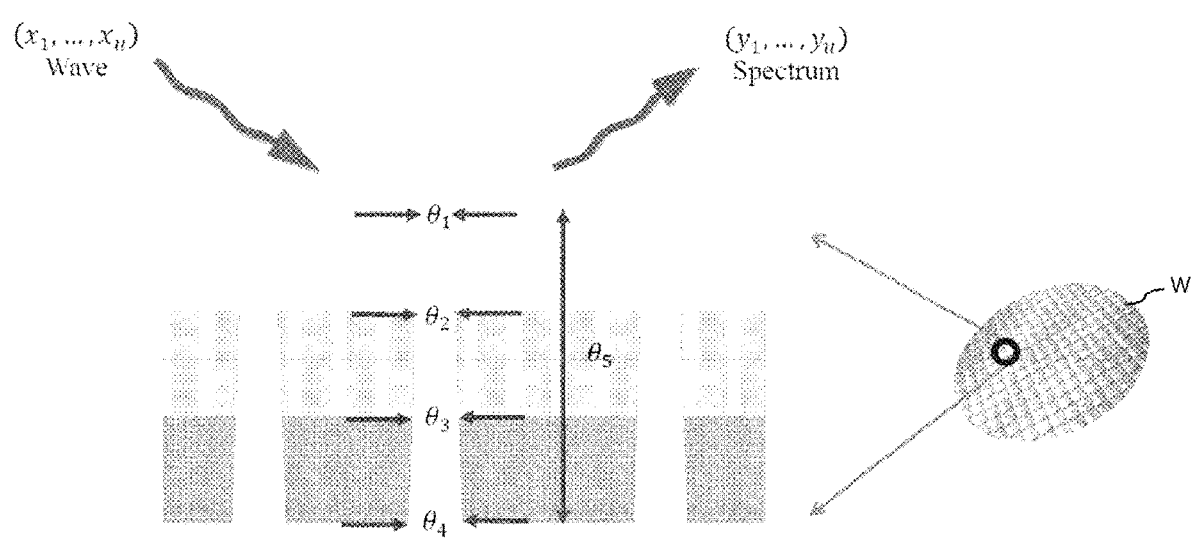
FIG. 1A is a diagram illustrating a method of estimating a CD (Critical Dimension) by using an OCD (Optical Critical Dimension) measuring method according to an embodiment of the present disclosure.

Hereinafter, various embodiments of the present disclosure will be described in detail with reference to the accompanying drawings.

The embodiments of the present disclosure are provided to more completely describe the present disclosure to those having a common knowledge in the related art, and the following embodiments may be modified in various other forms, and the scope of the present disclosure is not limited to the embodiments. Rather, these embodiments are provided to describe the present disclosure more faithfully and completely, and to fully convey the spirit of the present disclosure to those skilled in the art.

Further, in the following drawings, the thickness or size of each layer is exaggerated for convenience and clarity of description, and the same reference numerals in the drawings refer to the same elements. As used herein, the term, "and/or" includes any one and all combinations of one or more of the listed items.

The terminology used herein is used to describe a specific embodiment and is not intended to limit the present disclosure. As used herein, a singular form may include plural forms unless the context clearly indicates otherwise. Also, as used herein, the term such as "comprise" and/or "comprising" specifies the mentioned shapes, numbers, steps, actions, members, elements and/or the presence of these groups, and does not exclude the presence or addition of one or more other shapes, numbers, actions, members, elements and/or presence or addition of groups.

Although the terms, such as the first, the second, etc. are used herein to describe various members, components, regions, layers and/or portions, these terms are only used to distinguish one member, component, region, layer or portion from another region, layer or portion. Accordingly, the first member, component, region, layer or portion as described below may refer to the second member, component, region, layer or portion without departing from the teachings of the present disclosure.

Hereinafter, the embodiments of the present disclosure will be described with reference to the drawings. In the drawings, for example, the size and shape of the members may be exaggerated for convenience and clarity of description, and in actual implementation, modifications of the illustrated shape may be possible. Accordingly, embodiments of the present disclosure should not be construed as limited to the specific shapes of the members or regions shown herein. Hereinafter, various embodiments of the present disclosure will be described with reference to the drawings.

In an example of the present disclosure, when measuring a CD by using an optical critical dimension measuring method, a statistical optimization algorithm may be utilized. Specifically, the statistical optimization algorithm may presume a value of the CD of the model which can minimizes the difference level between a spectrum measured (hereinafter, referred to as a measurement spectrum) by using an OCD equipment and a spectrum (hereinafter, referred to as the numerical simulation spectrum) obtained from a model of RCWA (Rigorous Coupled Wave Analysis) as the CD of the measured spectrum. According to an example of the present disclosure, in a process of estimating an optimized CD from a model, matrix information of a parameter distribution per a batch unit, a linear transformation of a candidate parameter vector, and a filtering of the candidate parameter vector having the parameter distribution may be considered. The size of the batch unit may be a defined number of accumulated measurement target substrates on each of which semiconductor devices may be fabricated under uniform conditions for each measurement target substrate. For example, the batch unit may be a lot indicating a bundle of wafers. The parameter distribution may refer to a distribution of hypothetical CDs that the measurement target substrates in the batch unit may have, and may include the same multivariate normal distribution.

Figure 1B:
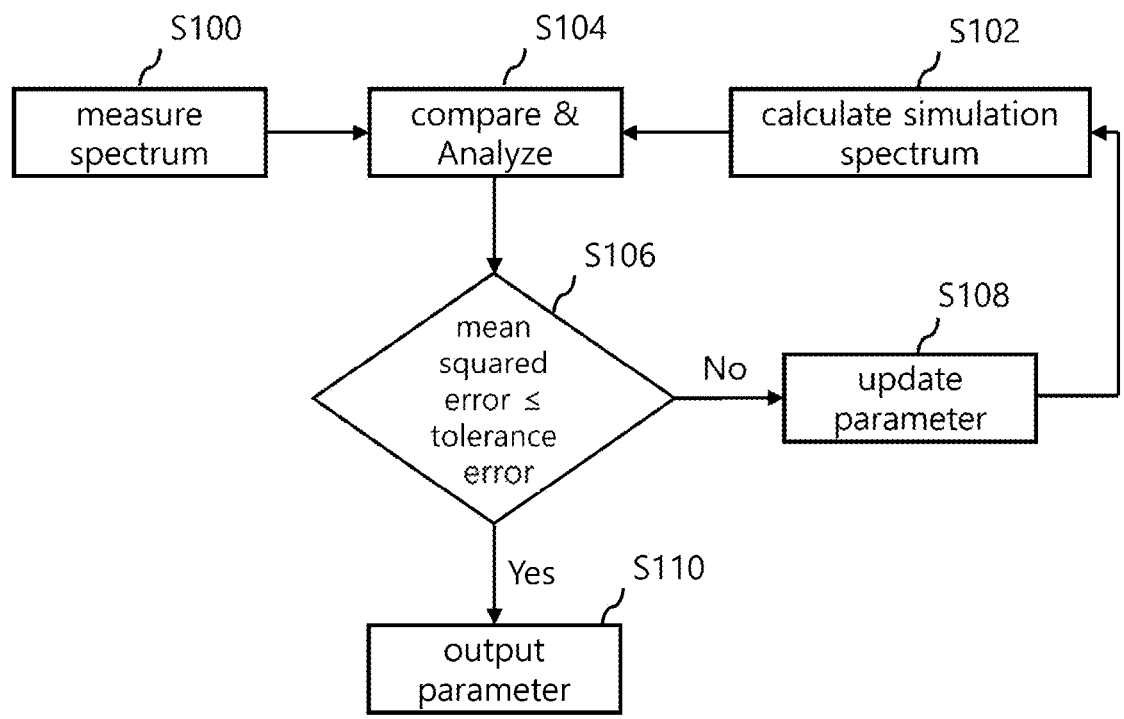
FIG. 1B is a flowchart illustrating a method of estimating a CD by using the OCD measuring method according to an embodiment of the present disclosure.
Figure 1C:
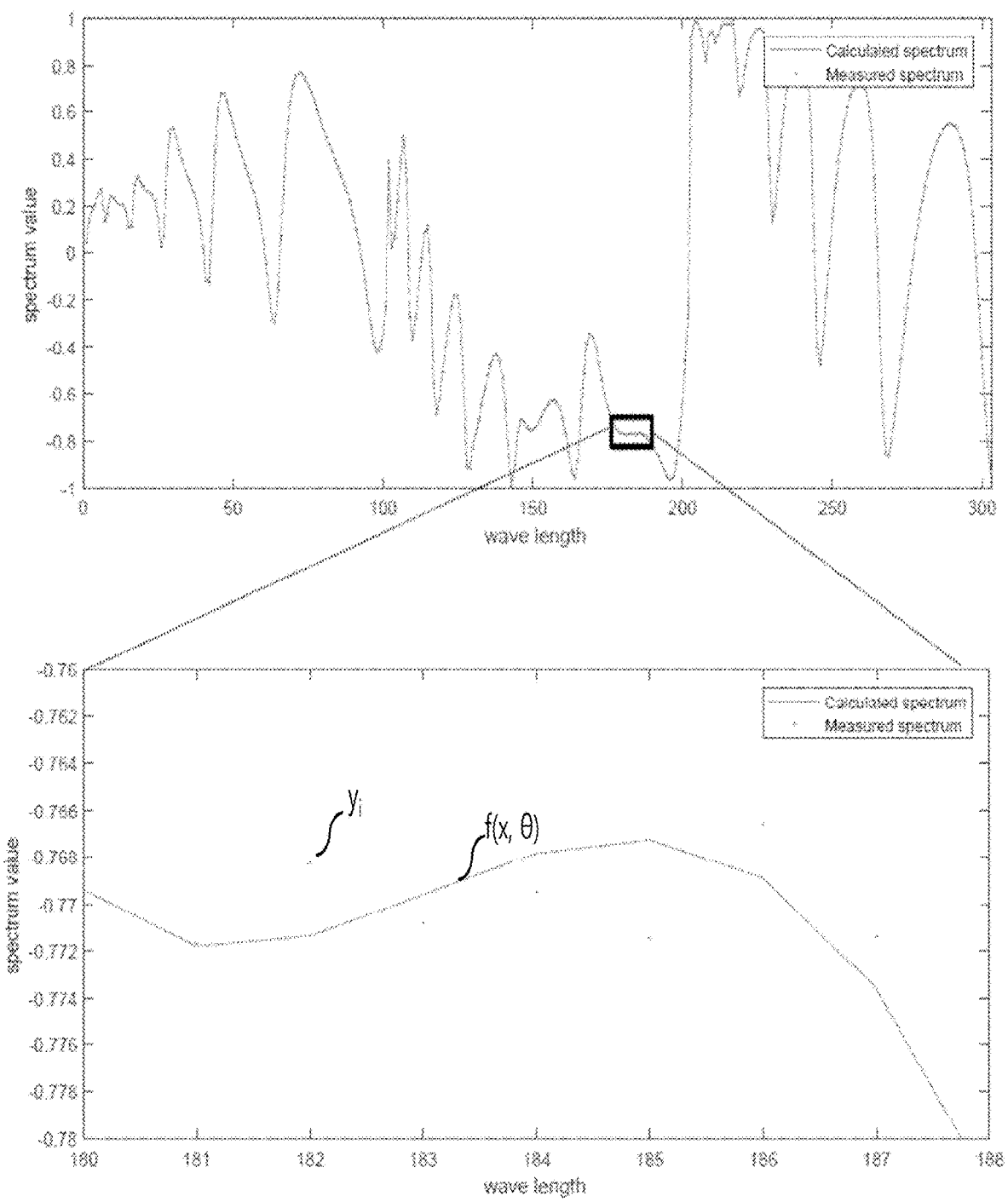
FIG. 1C is a graph showing a measurement spectrum and a numerical simulation spectrum.

FIG. 1A is a diagram illustrating a method of estimating a CD (Critical Dimension) by using an OCD (Optical Critical Dimension) measuring method according to an embodiment of the present disclosure, and FIG. 1B is a flowchart illustrating a method of estimating a CD by using the OCD measuring method according to an embodiment of the present disclosure, and FIG. 1C is a graph showing a measurement spectrum and a numerical simulation spectrum according to an embodiment of the present disclosure.

Referring to FIG. 1A, the OCD measuring method may estimate $CD1(\theta_1)$, $CD2(\theta_2)$, $CD3(\theta_3)$, $CD4(\theta_4)$, and $CD5(\theta_5)$ by irradiating an incident light having multiple wavelengths ($x_1, \ldots, x_u$) having a predetermined range on a substrate to be measured, i.e., a target substrate, such as a wafer W, and then analyzing a reflectance spectrum ($y_1, \ldots, y_u$) of a reflected light. $\theta_1$, $\theta_2$, $\theta_3$, $\theta_4$, and $\theta_5$ may represent depths of the three-dimensional shape, and $CD1(\theta_1)$, $CD2(\theta_2)$, $CD3(\theta_3)$, and $CD4(\theta_4)$ represent the width values according to each depth. $CD5(\theta_5)$ may be the total thickness value. The number or the interval of each depth, and a type of the CD value to be measured according to an embodiment are illustrated in FIG. 1A, but embodiments of the present disclosure are not limited thereto. For example, any number of depths may be a measurement target, and any feature such as an upper width or a lower width of a three-dimensional shape may be a measurement target. In addition, the 3D structure may have various shapes such as a line-and-space structure, a trench structure, a column structure, a macaroni structure, a fin structure, and a bridge structure. Depending on the shape, the measurement position and a type of the CD value to be measured may vary. Hereinafter, for convenience of description, the five depths $\theta_1$ to $\theta_5$ and the corresponding CD values, i.e., $CD_1(\theta_1)$ to $CD_5(\theta_5)$ illustrated in FIG. 1A will be described.

As an example, the measurement target wafer W shown in FIG. 1A has a three-dimensional structure having a trapezoidal cross-sectional structure which is perpendicular to a main surface of the wafer W and has a high aspect ratio (HAR). The CD values of the trapezoidal cross-sectional structure have a high correlation to each other. The characteristics of the trapezoidal cross-sectional structure may be inferred from $CD1(\theta_1)$, $CD2(\theta_2)$, $CD3(\theta_3)$, $CD4(\theta_4)$ and $CD5(\theta_5)$. By finding a numerical simulation spectrum close to the reflectance spectrum $(y_1, \ldots, y_u)$ (hereinafter, referred to as measurement spectrum), $CD1(\theta_1)$, $CD2(\theta_2)$, $CD3(\theta_3)$, $CD4(\theta_4)$ and $CD5(\theta_5)$ may be determined. In addition, since the numerical simulation spectrum may be generated by using the $CD1(\theta_1)$, $CD2(\theta_2)$, $CD3(\theta_3)$, $CD4(\theta_4)$ and $CD5(\theta_5)$ as input values, the HAR structure having $CD1(\theta_1)$, $CD2(\theta_2)$, $CD3(\theta_3)$, $CD4(\theta_4)$ and $CD5(\theta_5)$ may be estimated from reflectance spectrum $(y_1, \ldots, y_u)$ or the numerical simulation spectrum close to the measurement spectrum. The reflectance spectrum may be defined as an output values of the function, and $CD1(\theta_1)$, $CD2(\theta_2)$, $CD3(\theta_3)$, $CD4(\theta_4)$ and $CD5(\theta_5)$ may be defined as input values.

Referring to FIG. 1B, a process for searching the numerical simulation spectrum close to the measurement spectrum is illustrated. The searching process may be performed by an OCD measuring device which will be explained later. Measuring a measurement spectrum for each wavelength may be performed by the OCD measuring device (S100). A numerical simulation spectrum close to the measurement spectrum may be calculated (S102). Specifically, the numerical simulation spectrum may be an output spectrum which takes any one selected from a plurality of CD vectors, for example, $CD1(\theta_1)$, $CD2(\theta_2)$, $CD3(\theta_3)$, $CD4(\theta_4)$, $CD5(\theta_5)$ as input parameters.

Next, in order to calculate an error between the measurement spectrum and the numerical simulation spectrum, the measurement spectrum and the numerical simulation spectrum may be compared and analyzed (S104). For example, the error between the measurement spectrum and the numerical simulation spectrum may be a mean squared error.

Next, the mean squared error and a tolerance error may be compared to determine if the mean squared error between the measurement spectrum and the numerical simulation spectrum is within the tolerance error (S106). When the mean squared error is greater than the tolerance error, a candidate parameter may be updated by proceeding to a step S108. In an embodiment, the candidate parameter may be updated by using a heuristic algorithm. If the mean squared error is less than or equal to the tolerance error, a step S110 may be performed, and in a step S110, an input parameter of the measurement spectrum and the numerical simulation spectrum having the mean squared error may be output as a final candidate parameter.

As described above, steps S102 to S108 of estimating a candidate parameter for minimizing a difference between the measurement spectrum and the numerical simulation spectrum by comparing the measurement spectrum and the numerical simulation spectrum based on a nonlinear parameter estimating method may be repeated by the OCD measuring device, and finally, a numerical simulation spectrum having a solution difference against the measurement spectrum may be determined. At this time, final candidate parameters (for example, $CD1(\theta_1)$, $CD2(\theta_2)$, $CD3(\theta_3)$, $CD4(\theta_4)$ and $CD5(\theta_5)$) for determining the numerical simulation spectrum may be output (S110). In one embodiment, the nonlinear parameter estimation method may repeat a candidate parameter update process until the sum of squares of the difference between the measurement spectrum and the numerical simulation spectrum is less than or equal to a threshold, and a calculation process on the numerical simulation spectrum by using an updated candidate parameter and, consequently, it is possible to estimate the candidate parameters.

Conventionally, an optimized CD was derived by using the Gauss-Newton Method. The Gaussian-Newton method is a method progressively moving by a predetermined step by utilizing Jacobian using first-order partial derivative, or Hessian using second-order partial derivative in the direction of a gradient vector. However, in a given structure, such as the HAR structure, where the ratio of height to cross-sectional area is very large, very high correlation between the CDs is strongly exhibited, and in this case, as a local solution occurs, there may be a limit in reaching the CD of global solution to be estimated. That is, when using the Gaussian Newton method, it may be difficult to deduce a suitable CD parameter in a structure having a high correlation such as an HAR structure. In addition, heuristic algorithms such as GA (Genetic Algorithm), SA (Simulated Annealing), PSO (Partial Swarm Optimization), EA (evolutionary algorithms), TS (Tabu Search) or ACO (Ant Colony Optimization) may be used, but there may be also a limit in precision and speed for estimating CD in the HAR structure.

When being compared with the above conventional approach, according to an embodiment of the present disclosure, it is possible to accurately and quickly calculate and estimate a candidate parameter vector capable of modeling the measurement spectrum by combining a heuristic algorithm with the nonlinear parameter estimation, applying matrix information of the parameter distribution in batch units, performing linear transformation of the candidate parameter vector, and filtering of the candidate parameter vector having the parameter distribution.

In one embodiment, when an inspection process is performed in batch units for any structure of a target to be measured, assuming that the parameter distribution of one batch unit has the same massive variate normal distribution, the matrix information of the parameter distribution of the batch unit may be hypothesized information that may be determined before estimating the candidate parameter vector. For example, a large variate normal distribution may be assumed for CDs of wafers in a lot unit. In one embodiment, the CD estimation may be performed in units of lots. In addition, the parameter distribution may be displayed as matrix information, and the matrix information may include a mean vector and a covariance matrix of the parameter distribution.

In one embodiment, a lower triangular matrix (C) may be derived by using a Cholesky decomposition method for the covariance matrix ($\Sigma$) of the hypothesized parameter distribution ($\Sigma$=CC'). Here, C' is a transpose matrix of the lower triangular matrix. Linear transformation of the candidate parameter vector may be performed by using the derived lower triangular matrix C.

In one embodiment, the linear transformation of the candidate parameter vectors is to transform all candidate parameter vectors into a standardized coordinate system by linear transformation. A candidate parameter vector may be generated by applying a heuristic algorithm in the transformed standardized coordinate system. According to an embodiment of the present disclosure, inaccuracy and inefficiency of a heuristic algorithm which are generated due to a high correlation between the parameters may be improved through linear transformation of the candidate parameter vector.

In one embodiment, the filtering of the candidate parameter vector having the parameter distribution may be a process for rendering the candidate parameter vector generated through the heuristic algorithm to have the hypothesized parameter distribution. By rendering the candidate parameter vector to have the hypothesized parameter distribution, it is possible to reduce the parameter estimation time by removing drastically the calculation of unnecessary objective function values while maintaining accuracy in the iterative candidate parameter estimating process.

In an embodiment, the parameter estimation of a batch unit for a target structure may be modeled as shown in Equation 1 as below.

$$\theta^{(j)} := \mathrm{argmin}_{\theta \in \Theta}\, g(\theta), \qquad \text{[Equation 1]}$$
$$\text{where } g(\theta) = \sum_{i=1}^{N_e} \left(y_i^{(j)} - f(x_i^{(j)}; \theta)\right)^2,$$
$$\text{for } j = 1, 2, \ldots, b.$$

Here, j is the size of the batch unit, $\theta^{(j)} = [\theta_1^{(j)} \theta_2^{(j)} \ldots \theta_p^{(j)}]'$ is defined in relation to $\theta^{(j)}$, and refers to a p-dimensional candidate parameter which can minimize the difference between the measurement spectrum and the numerical simulation spectrum for each substrate to be measured, and $g^{(\theta)}$ is an objective function defined as the sum of squares of the difference between the two values. $x_i^{(j)}$ denotes the i-th wavelength value of the j-th substrate to be measured, $y_i^{(j)}$ denotes the i-th input value of the independent variable for the j-th substrate to be measured, and refers to the i-th output value of the dependent variable for the j-th substrate to be measured, and $f(x;\theta)\bullet$ is a function of the numerical simulation spectrum while designating x and $\theta$ vectors as inputs.

Referring to FIG. 1C, the numerical simulation spectrum may be defined as a function $f(x, \theta)$ in which input wavelengths $(x_1, x_2, \ldots, x_u)$ and $CD(\theta_1, \theta_2, \theta_3, \theta_4, \theta_5)$ are designated as input values. Based on the reflectance spectrum $(y_1, y_2, \ldots, y_u)$ or the measurement spectrum for each wavelength, the optimized CD value may be inferred by searching for $CD(\theta_1, \theta_2, \theta_3, \theta_4, \theta_5)$ close to the measurement spectrum. That is, when the measurement spectrum for each wavelength is determined, $CD(\theta_1, \theta_2, \theta_3, \theta_4, \theta_5)$ defining the numerical simulation spectrum close to the measurement spectrum may be searched according to the method for estimating the nonlinear parameter according to an embodiment of the present disclosure.

Figure 2A:
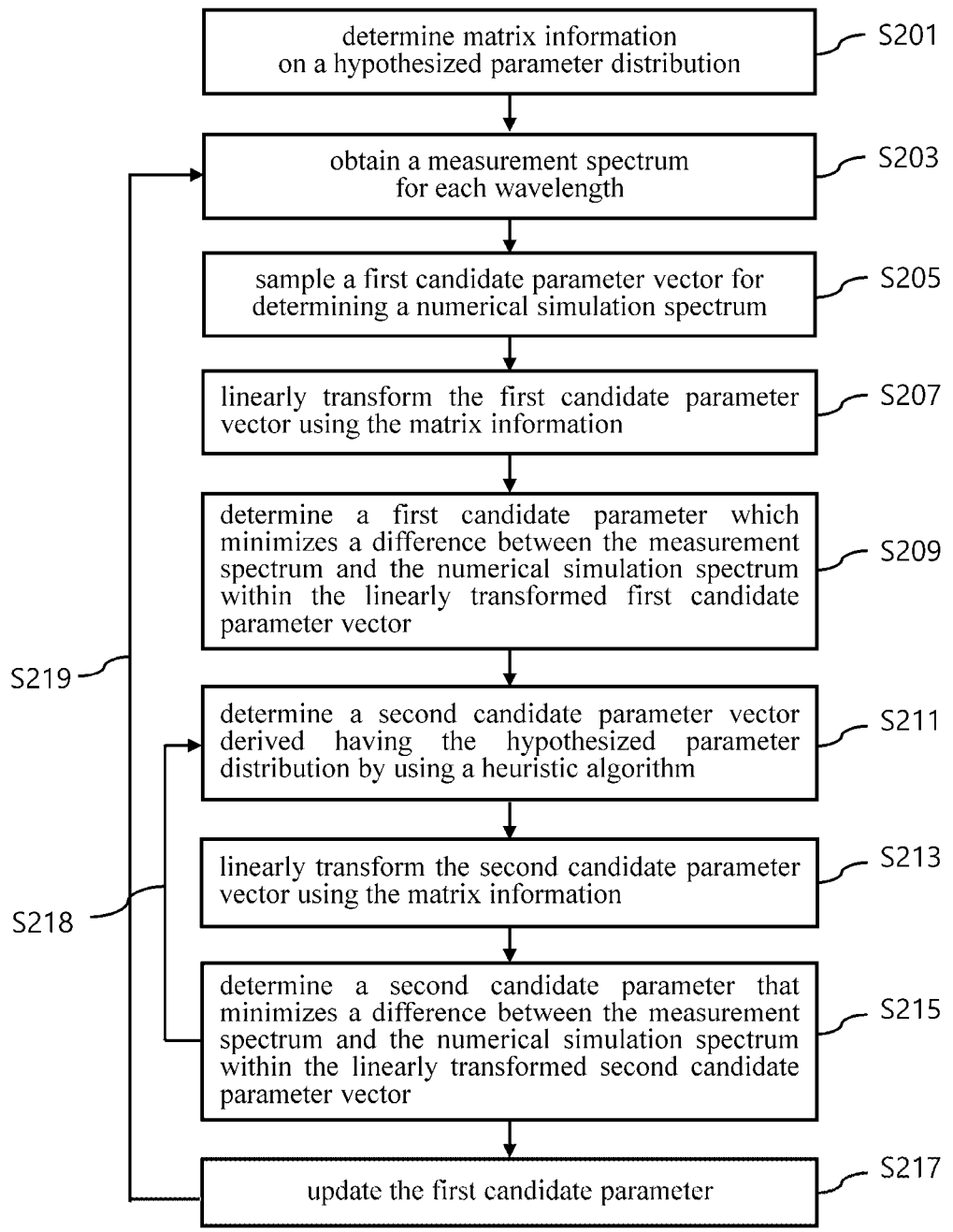
FIG. 2A and FIG. 2B are flowcharts each illustrating a method of estimating a CD by using the OCD measuring method according to an embodiment of the present disclosure.
Figure 2B:
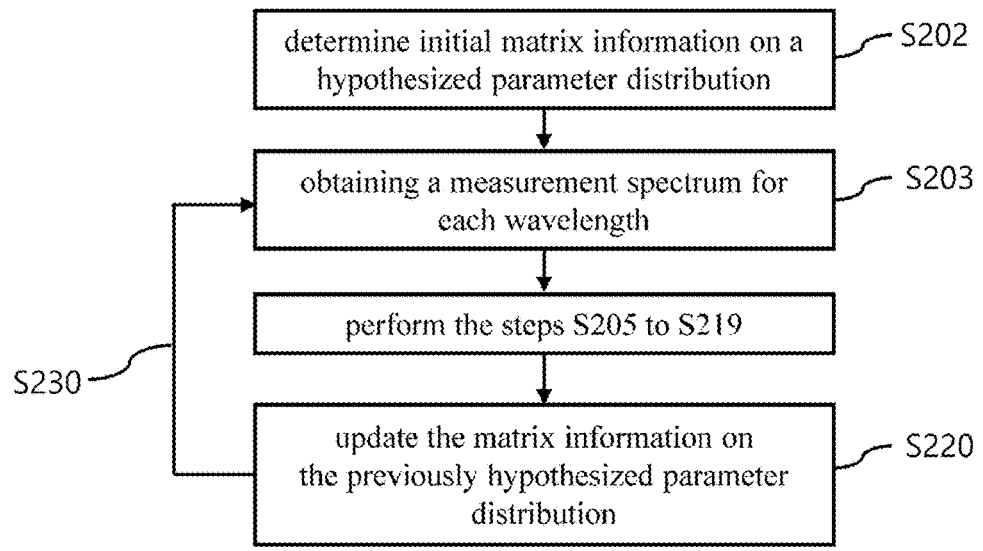

FIG. 2A and FIG. 2B are flowcharts each illustrating a method for estimating a CD by using the OCD measuring method according to an embodiment of the present disclosure.

Referring to FIG. 2A, a step S201 for determining matrix information on a hypothesized parameter distribution regarding a CD of a 3D structure constituting an electronic device by an OCD measuring device; a step S203 for obtaining a measurement spectrum for each wavelength of a light reflected from the 3D structure; a step S205 for sampling a first candidate parameter vector for determining a numerical simulation spectrum that approximates the measurement spectrum; a step S207 for linearly transforming the first candidate parameter vector using the matrix information; and a step S209 for determining a first candidate parameter which minimizes a difference between the measurement spectrum and the numerical simulation spectrum within the linearly transformed first candidate parameter vector are performed. Then, a step S211 for determining a second candidate parameter vector derived from the first candidate parameter and having the hypothesized parameter distribution by using a heuristic algorithm; a step S213 for linearly transforming the second candidate parameter vector using the matrix information; a step S215 for determining a second candidate parameter that minimizes a difference between the measurement spectrum and the numerical simulation spectrum within the linearly transformed second candidate parameter vector; and a step S217 for updating the first candidate parameter by using the second candidate parameter may be performed. In one embodiment, the 3D structure constituting the device may include, for example, a High Aspect Ratio (HAR) structure having a cross-sectional aspect ratio of 20:1 to 20,000:1. The HAR structure may be a part of a NAND flash memory device having a vertical NAND cell array of a 3D vertical stack structure, such as a TCAT (Terabit Cell Array Transistor) or BiCs (bit-cost Scalable) structure, or may be at least a part of a transistor device such as a vertical DRAM cell or a fin-FET. The hypothesized parameter distribution may be a distribution of parameters that may be sampled from the same multivariate normal distribution, and may be predictable information. However, embodiments of the present disclosure are not limited to the HAR structure. For example, it may be applied to an arbitrary convex polygonal structure, or a 3D structure having a circular or elliptical cross-section which may have a high correlation between parameters.

In an embodiment, the matrix information may include a mean vector and a covariance matrix of the hypothesized parameter distribution. The step S201 for determining the matrix information may include a step for decomposing the covariance matrix into a product of a lower triangular matrix and a transpose matrix of the lower triangular matrix. In an embodiment, the covariance matrix may be decomposed into a product of a lower triangular matrix and a transpose of the lower triangular matrix using Cholesky decomposition.

In one embodiment, the step S207 for linearly transforming the first candidate parameter vector may be performed by a step for multiplying the first candidate parameter vector by the lower triangular matrix to output a first output vector, and a step for adding the first output vector and the average vector (or mean vector) to output a second output vector. The lower triangular matrix may be a matrix decomposed from a covariance matrix of the matrix information. Specifically, the lower triangular matrix C may be determined through the Cholesky decomposition of the covariance matrix $\Sigma$ ($\Sigma = CC'$). Here, C' is a transposed matrix of the lower triangular matrix C. Linear transformation of the candidate parameter vector may be performed by using the determined lower triangular matrix C. By linearly transforming the candidate parameter vector using the determined lower triangular matrix C, it is possible to improve inaccuracies and deterioration in efficiency of a heuristic algorithm that may occur due to a high correlation between parameters.

In one embodiment, in connection with the step S209 for determining the first candidate parameter, the first candidate parameter may be estimated from the first candidate vector such that the sum of square values of the difference between the measurement spectrum and the numerical simulation spectrum may be less than or equal to a threshold based on the nonlinear parameter estimation method.

In an embodiment, the step S211 of determining the second candidate parameter vector having the hypothesized parameter distribution may generate a second candidate parameter vector by using a heuristic algorithm that may take the first candidate parameter as an input. For example, when the first candidate parameter includes a plurality of CDs capable of determining the HAR structure which is a 3D structure, for example, CD1($\theta_1$), CD2($\theta_2$), CD3($\theta_3$), CD4($\theta_4$), and CD5($\theta_5$) in FIG. 1A, the heuristic algorithm may correct CD1($\theta_1$), CD2($\theta_2$), CD3($\theta_3$), CD4($\theta_4$), CD5 ($\theta_5$), respectively, where the plurality of second candidate parameters may be generated from the first candidate parameter according to each of CD1($\theta_1$), CD2($\theta_2$), CD3($\theta_3$), CD4($\theta_4$), and CD5($\theta_5$). The plurality of second candidate parameters may be referred to as a second candidate parameter vector. The heuristic algorithm may include any one of GA (Genetic Algorithm), SA (Simulated Annealing), PSO (Partial Swarm Optimization), EA (evolutionary algorithms) TS (Tabu Search), CRS (Controlled Random Search), and ACO (Ant Colony Optimization). However, embodiments of the present disclosure are not limited to these heuristic algorithms, and other heuristic algorithms may also be applied.

In one embodiment, the step S211 for determining the second candidate parameter vector having the hypothesized parameter distribution may determine a second candidate parameter vector by selecting (or screening) only second candidate parameters based on the hypothesized parameter distribution among all second candidate parameters derived from the first candidate parameter. According to an embodiment of the present disclosure, unnecessary calculation of an objective function value during the nonlinear parameter estimation process may be reduced, and a candidate parameter estimation process may be performed quickly and accurately by selecting only the second candidate parameters following the hypothesized parameter distribution. In other words, the nonlinear parameter estimation may be quickly and accurately performed for a first plurality of the second candidate parameters more likely to be selected by excluding a second plurality of the second candidate parameters less likely to be selected from the candidate solution, and instead, including the first plurality of the second candidate parameters.

The criterion for selecting the second candidate parameter based upon the hypothesized parameter distribution may be performed through Equation 2 as below.

$$R \leq \max\left\{ \frac{\prod_{m=1}^{p} h(\tilde{\theta}_m^c)}{(h(0))^p}, \phi \right\}, \quad \text{[Equation 2]}$$

Here, R is a uniform random number with an independent and identical distribution (i.i.d) between 0 and 1, h(x) is the probability density function of the standard normal distribution, φ is a user-specified value between 0 and 1, and $\tilde{\theta}_m^c$ is the second candidate parameter derived from the first candidate parameter, and m refers to a dimension of the three-dimensional structure. For example, the dimension of the HAR structure of FIG. 1A may be 5 dimensions, which indicates that the corresponding HAR structure may be inferred by 5 CDs.

In an embodiment, the step S213 for linearly transforming the second candidate parameter vector using the matrix information may be performed prior to the step S215 for selectively determining the second candidate parameter. Even if the above-described first candidate parameter is linearly transformed, since the second candidate parameter vector that may be searched from the linearly transformed first candidate parameter may be a value before linear transformation rather than a linearly transformed value, step S213 may be performed optionally. Specifically, if the second candidate parameter vector exists in the linearly transformed coordinate system space, the step S213 may be omitted, whereas if the second candidate parameter vector exists in the pre-linear transformed coordinate system space, the step S213 may be performed. As in step S209, the step S213 for linearly transforming the second candidate parameter vector may include a step for multiplying the second candidate parameter vector by a lower triangular matrix decomposed from the covariance matrix of the matrix information to output a first output vector, and a step for outputting a second output vector by adding the first output vector and the average vector of the matrix information.

In an embodiment, optionally, the step S211 for determining a second candidate parameter vector having the hypothesized parameter distribution may further include a step for performing inverse linear transformation of the first candidate parameter. The heuristic algorithm generates the second candidate parameter vector from the first candidate parameter, and in this case, a linearly transformed or not yet linearly transformed first candidate parameter may be used. Therefore, when the heuristic algorithm uses the first candidate parameter that is not yet linearly transformed, the first candidate parameter is already linearly transformed in the previous step, and thus the step for performing inverse linear transformation may be required for the first candidate parameter. Herein, the linear transformation may refer to a step for moving a candidate parameter from an original coordinate system to a linearly transformed coordinate system, which will be described with reference to FIG. 3 later, and the inverse linear transformation may refer to a step for moving a candidate parameter from a linearly transformed coordinate system to an original coordinate system.

In one embodiment, steps S211 to S215 may be performed until a threshold condition is satisfied (step S218). The threshold condition may include information on whether to satisfy the total computational budget or the target accuracy of the highest parameter vector. In the case of the total calculation budget, when the number of executions of the function estimation operation steps including steps S211 to S215 reaches a set value or when the execution time of the function estimation operation steps reaches a set value (or a set time interval), the function estimation computation steps may be stopped. The target accuracy of the highest parameter vector may be obtained by calculating the value of $R^2$, which is a determination index between the data set and the data from the model, in all parameter vectors of the P set, and when the difference between the maximum and solution $R^2$ values is smaller than the user-specified constant, the steps S211 to S215 may be stopped.

In one embodiment, the step S217 for updating the first candidate parameter includes a step for selecting, as a final candidate vector, a candidate vector that satisfies a critical condition (or a threshold condition) through the repeated process of the steps S211 to S215.

In an embodiment, the steps S203 to S217 are repeatedly performed as many as batch units of the substrate to be measured, and a final candidate parameter for determining the numerical simulation spectrum for each substrate to be measured may be determined (S219). The hypothesized parameter distribution is probabilistic statistical data of a plurality of parameters obtained by repetitively performing the steps S203 to S217 by the batch unit, and may include a multivariate normal distribution. Each parameter in the first candidate parameter vector or the second candidate parameter vector has an average of 0 and a variance of 1 in a linearly transformed coordinate system, and may have statistically independent characteristics.

A method for estimating a critical dimension according to an embodiment of the present disclosure disclosed with reference to FIG. 2A may be described in the following order.

Step 0: Set user-input parameters ($\phi$) and set $0<\phi<1$ and the mean vector ($\mu$) of the hypothesized distribution, and set covariance matrix ($\Sigma$). Number of repetitions j is set to 1.

Step 1: Decompose the covariance matrix ($\Sigma$) into $\Sigma=CC^T$ (C: lower triangular matrix) through Cholesky decomposition.

Collect the observed values, $x^{(j)}$, $y^{(j)}$, Number of repetitions k is set to 0, $\psi=\phi$.

Step 2: Generate a p dimensional sample candidate solution vector $(\tilde{\theta}_1, \tilde{\theta}_2, \ldots, \tilde{\theta}_n)$ that follows a multivariate standard normal distribution and generate a set of candidate solutions $P=\{\tilde{\theta}_1, \ldots, \tilde{\theta}_n\}$).

Step 3: After linear transformation to $\theta=\mu+C\tilde{\theta}$ for all candidate solutions in the set P, set $\tilde{\theta}_{min}=\mathrm{argmin}_{\tilde{\theta}\in P} g(\tilde{\theta})$ by evaluating the value $$g(\tilde{\theta}) = \frac{1}{Ne}\sum_{i=1}^{Ne}(y_i^{(j)} - f(x_i^{(j)};\theta))^2.$$

Step 4: Repeat the following process until the termination condition is satisfied.

Step 4-1: Using a heuristic algorithm, a new candidate solution vector $\tilde{\theta}^c=[\tilde{\theta}_1^c \tilde{\theta}_2^c, \ldots \tilde{\theta}_p^c]'$ is generated until the following conditions are satisfied (adoption & rejection method).

$$R \leq \max\left\{\frac{\prod_{m=1}^{p} h(\tilde{\theta}_m^c)}{(h(0))^p}, \psi\right\},$$

R is a probability variable with a uniform distribution between 0 and 1, $$h(x) = \frac{1}{\sqrt{2\pi}}e^{-\frac{x^2}{2}} := \frac{1}{Ne}\sum_{i=1}^{Ne}(y_i^{(j)}-f(x_i^{(j)};\theta^c))^2.$$

Step 4-2: After linear transformation to $\theta^c=\mu+C\tilde{\theta}^c$, evaluate the value of $g(\tilde{\theta}^c)$ Step 4-3: Set $k=k+1$ after updating P and $\tilde{\theta}_{min}^k$.

Step 5: Output $\tilde{\theta}^c=\mu+C\tilde{\theta}_{min}^k$ as parameters for the observed values, $x^{(j)}$, $y^{(j)}$.

Step 6: If j<b, where b is the size of the batch unit, go to the step 1 after setting, j=j+1. Otherwise, exit.

FIG. 2A is an example in which the hypothesized parameter distribution is already known or estimated. In another embodiment, when the hypothesized parameter distribution is not known, the distribution of the parameters may be estimated by performing the steps S205 to S217 as shown in FIG. 2B.

Referring to FIG. 2B, initial matrix information on a hypothesized parameter distribution may be determined (S202). Specifically, the mean vector ($\mu$) and the covariance matrix ($\Sigma$) of the initial hypothesized distribution may be set to $\mu=0$ and $\Sigma=I_p$, respectively, and if $\hat{\Sigma}$ is a positive sign matrix and j≥τ is satisfied, $\mu=\hat{\mu}$ and $\Sigma=\hat{\Sigma}$ may be set. Here, τ is a positive integer and has a condition, τ<b and b is the size of the batch unit. Next, we may decompose the covariance matrix ($\Sigma$) into $\Sigma=CC^T$ by using Cholesky decomposition.

Thereafter, by using the initial matrix information, the step S203 for obtaining a measurement spectrum for each wavelength from the 3D structure may be performed, and the same steps S205 to S219 of FIG. 2A may be performed based on the measurement spectrum for each wavelength. As the steps S203 to S219 are the same as steps S203 to S219 of FIG. 2A, the detailed descriptions of steps S203 to S219 of FIG. 2A may be omitted for the interest of brevity.

Thereafter, matrix information on the previously hypothesized parameter distribution, that is, the mean vector ($\mu$) and the covariance matrix ($\Sigma$) may be updated by Equations 3 and 4 as indicated below (S220). The steps S203 to S220 may be repeatedly performed as many as batch units of the target substrate to be measured, so that the matrix information on the previously hypothesized parameter distribution may be updated (S230).

$$\hat{\mu} = \frac{1}{j}\sum_{\gamma=1}^{j}\tilde{\theta}^{(\gamma)} \quad \text{[Equation 3]}$$

$$\hat{\Sigma} = \frac{1}{j}\sum_{\gamma=1}^{j}\tilde{\theta}^{(\gamma)}(\tilde{\theta}^{(\gamma)})' - \hat{\mu}(\hat{\mu})'. \quad \text{[Equation 4]}$$

In an embodiment, optionally, the step for updating the mean vector ($\mu$) and the covariance matrix ($\Sigma$) as the matrix information based on Equations 3 and 4 may be further performed by using the measurement spectrum.

FIG. 2B may be described according to the following order.

Step 0: Set positive integer ($\tau$). Set input parameter $\phi$ ($0<\phi<1$), and set $\psi=1$, $\mu=0$, and $\Sigma=I_p$, respectively. Number of repetitions j is set to 1.

Step 1: If $\hat{\Sigma}$ is a positive sign matrix and j≥τ is satisfied, $\psi=\phi$, $\mu=\hat{\mu}$, and $\Sigma=\hat{\Sigma}$ are set, and it is decomposed into a covariance matrix $\Sigma=CC^T$ through Cholesky decomposition (C: a lower triangular matrix).

Collect the observed values, $x^{(j)}$, $y^{(j)}$ and number of repetitions k is set to k=0.

Steps 2-5: Search by the heuristic algorithm based on distribution described above with reference to FIG. 2A.

Step 6:

$$\hat{\mu} = \frac{1}{j}\sum_{\gamma=1}^{j}\tilde{\theta}^{(\gamma)} \text{ and } \hat{\Sigma} = \frac{1}{j}\sum_{\gamma=1}^{j}\tilde{\theta}^{(\gamma)}(\tilde{\theta}^{(\gamma)})' - \hat{\mu}(\hat{\mu})'$$

are updated.

If j<b, go to step 1 after setting j=j+1. Otherwise, the framework ends.

Figure 3:
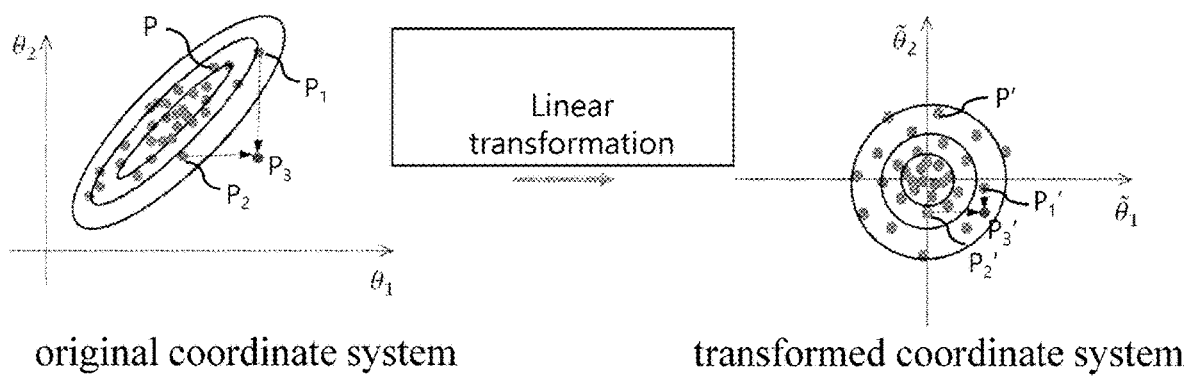
FIG. 3 is a diagram for explaining a linear transform for a candidate parameter vector according to an embodiment of the present disclosure.

FIG. 3 is a diagram for explaining a linear transform for a candidate parameter vector according to an embodiment of the present disclosure.

Referring to FIG. 3, candidate parameters p are distributed in a two-dimensional original coordinate system. Each of the candidate parameters p, for example, $CD1(\theta_1)$ and $CD2(\theta_2)$ may be represented in the two-dimensional original coordinate system. In the process for estimating nonlinear parameters, when analyzing the shape of a high aspect ratio specially with a high correlation between the parameters, the candidate parameter P3 which is present out of the distribution due to the high correlation between the two candidate parameters P1 and P2 in the two-dimensional original coordinate system. In this case, accuracy and efficiency may be deteriorate when the optimization parameter is searched by using the candidate parameter P3.

In an embodiment of the present disclosure, in order to address this issue, the candidate parameters P of the two-dimensional original coordinate system may be moved to the candidate parameters P' of the two-dimensional transformed coordinate system through a linear transformation. Specifically, the lower triangular matrix (C) may be derived from the covariance matrix (Σ) of the hypothesized parameter distribution by using the Cholesky decomposition (Σ=CC^t). All candidate parameters of the two-dimensional original coordinate system are linearly transformed, and then transformed into a standardized transform coordinate system by using the derived lower triangular matrix (C) and the average vector (μ) of the hypothesized parameter distribution. The relationship between the vector of θ(θ1, θ2) of the candidate parameter P of the original coordinate system and the vector $\bar{\theta}$ of the candidate parameter P' of the transformed coordinate system may be defined by Equation 5 as below:

$$\theta = \mu + C\bar{\theta} \quad \text{[Equation 5]}$$

Here, θ refers to the candidate parameter of the original coordinate system, $\bar{\theta}$ is the candidate parameter of the transform coordinate system, μ is the mean vector of the hypothesized parameter distribution, and C is the lower triangular matrix decomposed from the covariance matrix (Σ) of the hypothesized parameter distribution.

As described above, when a new candidate parameter is generated by combining two candidate parameters existing in the original coordinate system, a new candidate parameter which is present out of the distribution is generated due to the high correlation between the two candidate parameters P1 and P2. A possibility for generating a candidate solution that is unlikely to be an actual solution may increase, and thus the accuracy and efficiency of an operation for calculating an optimal candidate parameter may be degraded. However, when the candidate parameters p of the original coordinate system are linearly transformed into the transformed coordinate system, the possibility that the candidate parameter $P_3'$ generated within the distribution range due to the low correlation between the two candidate parameters $P_1'$ and $P_2'$ is an actual solution may be increased, and thus, the accuracy and the speed for deriving candidate solution may be improved.

Figure 4:
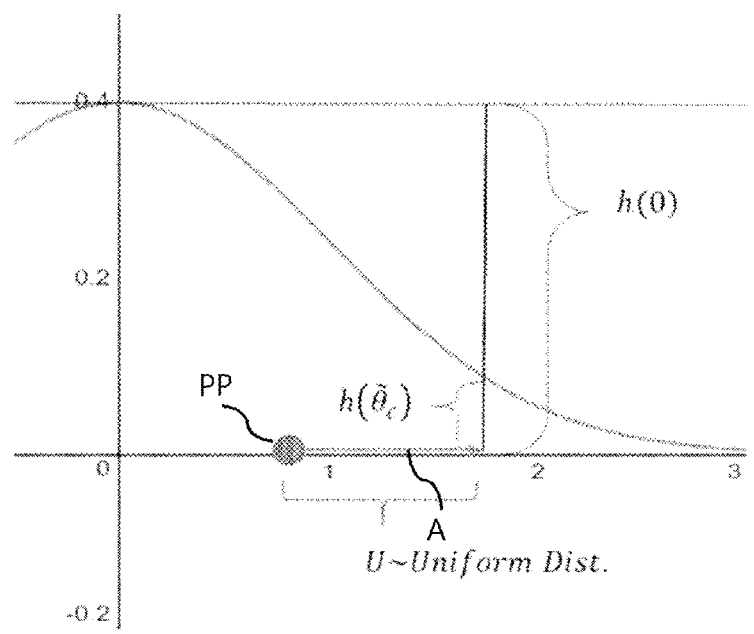
FIG. 4 is a diagram illustrating filtering a candidate parameter vector having a hypothesized parameter distribution according to an embodiment of the present disclosure.

FIG. 4 is a graph illustrating a method of filtering a candidate parameter vector having a hypothesized parameter distribution according to an embodiment of the present disclosure. FIG. 4 is a diagram illustrating an example of the case where the parameter is one-dimensional (p=1) for the above Equation 1.

Referring to FIG. 4, the candidate parameters may be selected by using a uniform probability variable in a heuristic algorithm based on Equation 1 so that candidate parameters that may be generated through the heuristic algorithm have the hypothesized distribution. Specifically, the dots PP represent a candidate solution, and the arrow A represents a moving direction and a moving distance. In a conventional heuristic algorithm, a moving distance of the candidate solution may be determined in a direction set through a uniform probability variable. In an embodiment of the present disclosure, the generated candidate solutions may have a hypothesized distribution rather instead of a uniform probability distribution. h(x) is the probability density function of the standard normal distribution, and the candidate solution is selected with the probability of $$\frac{\prod_{m=1}^{p} h(\bar{\theta}_m^c)}{(h(0))^p}.$$

Therefore, according to an embodiment of the present disclosure, the probability of selecting a candidate solution for which a chance that an actual candidate parameter likely exists in the hypothesized distribution may be increased, whereas the probability of selecting a candidate solution for which a chance that an actual candidate parameter unlikely exists may be reduced.

In an embodiment, in order to reduce a case in which a candidate solution may not be selected due to a very low selection probability in Equation 1, a user-specified value (φ) may be designated as a value between 0 and 1. If the value φ close to 1 is used, the probability of selecting a candidate solution increases, but the complexity may increase relatively because information on the much more hypothesized distribution may not be used. On the other hand, if a value close to 0 is used, the probability of selecting a candidate solution is lowered, but complexity may be reduced by utilizing a lot of information on the hypothesized distribution. Therefore, it is preferable to determine the value φ in consideration of the accuracy of the hypothesized distribution or the time taken to evaluate the performance of the sampled candidate solution.

As described above, for minimizing the sum of squares of the difference between the measurement spectrum and the numerical simulation spectrum in the iterative nonlinear parameter estimation process, the calculation of unnecessary objective function values may be minimized by rendering the candidate parameters generated by using the uniform random variable in the heuristic algorithm to have the hypothesized distribution. Therefore, the parameter may be estimated faster and more accurately than the conventional method.

Figure 5:
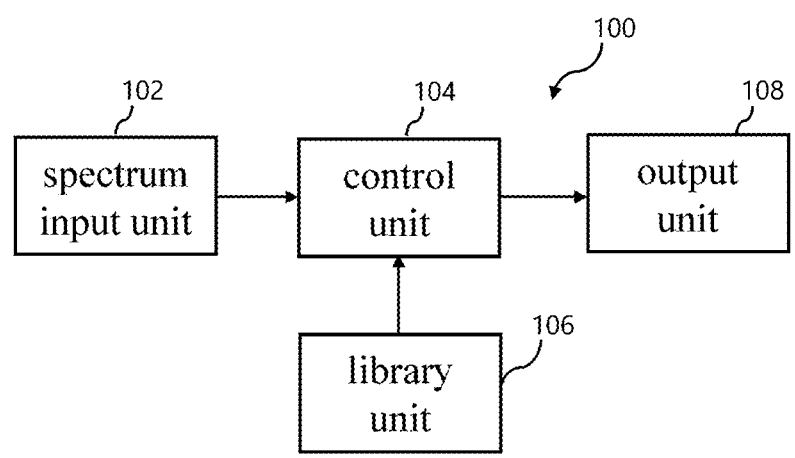
FIG. 5 is a diagram showing a configuration of an apparatus for estimating a CD according to an embodiment of the present disclosure.

FIG. 5 is a diagram showing a configuration of an apparatus for estimating a CD according to an embodiment of the present disclosure.

Referring to FIG. 5, the apparatus 100 for calculating a CD outputs a computing result obtained by using predetermined input information such as a spectrum for each wavelength and matrix information of a hypothesized parameter distribution, and stored information. The device 100 may include a notebook, a computer, or a device capable of executing and implementing other algorithms. In another embodiment, the device 100 of FIG. 5 may include a dedicated computing device that performs a CD estimating task. The device 100 may include a software component or a hardware component as detailed components.

The apparatus 100 is composed of a spectrum input unit (e.g., spectrum input device or spectrum input circuit) 102, a library unit (e.g., library circuit) 106, an output unit (e.g., output generator or output circuit) 108, and a controller unit (e.g., control circuit) 104 which controls them, and estimates an optimal CD. The spectrum input unit, the library unit, the output unit and the controller unit 104 may be implemented as a software code to perform a predetermined optimization algorithm, or any one of hardware chips such as a processor implementing the software code, or a combination thereof.

The library unit 106 may return a function value (a numerical simulation spectrum) corresponding to the sample data in calculating the sample data (a CD vector or a candidate parameter vector) in the nonlinear parameter estimation algorithm of the present disclosure to the controller unit 104. In order to calculate optimal sample data, the library unit 106 may determine necessary information such as matrix information on a hypothesized parameter distribution about a critical dimension of a three-dimensional structure constituting an element.

Information on the numerical simulation spectrum corresponding to the sample data may be stored in the library unit 106, and the sample data may be fixed or may be added in the process of newly calculating the sample data. In addition, CDs may be added or changed by calculating the spectrum according to the RCWA (Rigorous Coupled Wave Analysis) simulation under the control of the controller unit 104. The output unit 108 may output a CD of a model that minimizes the difference between the numerical simulation spectrum calculated by the library unit 106 based on the input measurement spectrum and the CD, that is, a sample data calculated by the controller unit 104. In addition, the controller unit 104 may calculate sample data using a heuristic algorithm, and compare the numerical simulation spectrum calculated by the library unit 106 with the measurement spectrum to provide sample data minimizing the difference as a CD parameter.

A measurement spectrum measured for each wavelength from a 3D structure may be input to the device 100 through the spectrum input circuit 102 from an optical measurement device (not shown). Using the input spectrum, the controller 104 may extract various sample data and return a spectrum corresponding to each sample data from the library 106, and a sample data, i.e. the CD of the model, which minimizes the difference between the input spectrum and the spectrum corresponding to the sample data may be calculated.

The controller unit 104 samples a first candidate parameter vector that determines a numerical simulation spectrum that is close to the measurement spectrum, and linearly transforms the first candidate parameter vector by using the matrix information. In the linearly transformed first candidate parameter vector, a first candidate parameter which minimizes the difference between the measurement spectrum and the numerical simulation spectrum is determined, and a second candidate parameter vector derived from the first candidate parameter and having the hypothesized parameter distribution is determined by using a heuristic algorithm. In addition, in the second candidate parameter vector, a second candidate parameter for minimizing MSE (Mean Square Error) of the measurement spectrum and the numerical simulation spectrum may be calculated, wherein the MSE may be calculated as an average of the sum of squared differences between the measurement spectrum measured for each wavelength and the numerical simulation spectrum provided by the library unit 106.

Although many contents are specifically described in the above description, they should be interpreted as specific examples rather than limiting the scope of the disclosure, and various modifications may be possible. Therefore, the scope of the present disclosure is not defined by the described embodiments, but should be determined by the technological concepts described in the claims.

What is claimed is:

1. A method of measuring a critical dimension of a three-dimensional structure constituting a device, the method comprising:
    determining matrix information on a hypothesized parameter distribution on the critical dimension;
    obtaining a measurement spectrum for each wavelength of a light reflected from the three-dimensional structure;
    sampling a first candidate parameter vector for determining a numerical simulation spectrum that approximates the measurement spectrum;
    linearly transforming the first candidate parameter vector by using the matrix information;
    determining a first candidate parameter which minimizes a difference between the measurement spectrum and the numerical simulation spectrum within the linearly transformed first candidate parameter vector;
    determining a second candidate parameter vector derived from the first candidate parameter and having the hypothesized parameter distribution by using a heuristic algorithm;
    determining a second candidate parameter that minimizes a difference between the measurement spectrum and the numerical simulation spectrum within the second candidate parameter vector; and
    updating the first candidate parameter by using the second candidate parameter.

2. The method of the claim 1, wherein the matrix information includes a mean vector and a covariance matrix of the hypothesized parameter distribution, and
    wherein determining the matrix information comprises decomposing the covariance matrix into a product of a lower triangular matrix and a transpose matrix of the lower triangular matrix.

3. The method of the claim 2, wherein linearly transforming the first candidate parameter vector comprises:
    multiplying the first candidate parameter vector by the lower triangular matrix to output a first output vector; and
    adding the first output vector and the mean vector to output a second output vector.

4. The method of the claim 1, further comprising linearly transforming the second candidate parameter vector by using the matrix information.

5. The method of the claim 4, wherein linearly transforming the second candidate parameter vector comprises:
    multiplying the second candidate parameter vector by a lower triangular matrix to output a first output vector, the lower triangular matrix being obtained by decomposing a covariance matrix of the matrix information; and
    adding the first output vector and a mean vector of the matrix information to output a second output vector.

6. The method of the claim 1, determining the second candidate parameter vector comprises selecting a third candidate parameter vector that satisfies the following equation:

$$R \leq \max\left\{\frac{\prod_{m=1}^{p} h(\tilde{\theta}_m^c)}{(h(0))^p}, \phi\right\},$$

wherein, R is a uniform random number having an independent and identical distribution (i.i.d) between 0 and 1, h(x) is a probability density function of a standard normal distribution, p is a size of the second candidate parameter vector, and $\tilde{\theta}_m^c$ is the second candidate parameter derived from the first candidate parameter, and $\phi$ is a user-specified value between 0 and 1.

7. The method of the claim 6, wherein determining the second candidate parameter vector further comprises inversely and linearly transforming the first candidate parameter.

8. The method of the claim 1, further comprising updating the matrix information by using the measurement spectrum.

9. The method of the claim 1, wherein obtaining the measurement spectrum, sampling the first candidate parameter vector, linearly transforming the first candidate parameter vector, determining the first candidate parameter, determining the second candidate parameter vector, determining the second candidate parameter, and updating the first candidate parameter are repeatedly performed by batch units for the three-dimensional structure constituting the device, and
wherein the hypothesized parameter distribution is probabilistic statistics data of a plurality of parameters obtained by repeatedly performing by the batch unit, and includes a multivariate normal distribution.

10. The method of the claim 1, wherein each parameter within the first candidate parameter vector or the second candidate parameter vector has an average of 0 and a variance of 1 in a linearly transformed coordinate system, and has statistically independent characteristics therebetween.

11. The method of the claim 1, wherein the heuristic algorithm includes any one of GA (Genetic Algorithm), SA (Simulated Annealing), PSO (Partial Swarm Optimization), EA (evolutionary algorithms), TS (Tabu Search), and ACO (Ant Colony Optimization).

12. An apparatus for measuring critical dimension of a three-dimensional structure constituting a device, the apparatus comprising:
a library unit configured to determine matrix information on a hypothesized parameter distribution on the critical dimension;
a spectrum input unit configured to obtain a measurement spectrum for each wavelength of a light reflected from the three-dimensional structure; and
a controller unit configured to sample a first candidate parameter vector for determining a numerical simulation spectrum that approximates the measurement spectrum, linearly transform the first candidate parameter vector by using the matrix information, determine a first candidate parameter that minimizes a difference between the measurement spectrum and the numerical simulation spectrum within the linearly transformed first candidate parameter vector, determine a second candidate parameter vector derived from the first candidate parameter and having the hypothesized parameter distribution by using a heuristic algorithm, determine a second candidate parameter which minimizes a difference between the measurement spectrum and the numerical simulation spectrum within the second candidate parameter vector, and update the first candidate parameter by using the second candidate parameter.

13. The apparatus of the claim 12, wherein the matrix information includes a mean vector and a covariance matrix of the hypothesized parameter distribution, and
wherein the library unit decomposes the covariance matrix into a product of a lower triangular matrix and a transpose matrix of the lower triangular matrix.

14. The apparatus of the claim 13, wherein the controller outputs a first output vector by multiplying the first candidate parameter vector by the lower triangular matrix, and outputs a second output vector by adding the first output vector and the mean vector.

15. The apparatus of the claim 12, wherein the controller linearly transforms the second candidate parameter vector by using the matrix information.

16. The apparatus of the claim 15, wherein the controller outputs a first output vector by multiplying the second candidate parameter vector by a lower triangular matrix, the lower triangular matrix being obtained by decomposing a covariance matrix of the matrix information, and outputs a second output vector by adding the first output vector and a mean vector of the matrix information.

17. The apparatus of the claim 12, wherein the controller selects a third candidate parameter vector that satisfies the following equation:

$$R \leq \max\left\{\frac{\prod_{m=1}^{p} h(\tilde{\theta}_m^c)}{(h(0))^p}, \phi\right\},$$

wherein, R is a uniform random number having an independent and identical distribution (i.i.d) between 0 and 1, h(x) is a probability density function of a standard normal distribution, p is a size of the second candidate parameter vector, and $\tilde{\theta}_m^c$ is the second candidate parameter derived from the first candidate parameter, and $\phi$ is a user-specified value between 0 and 1.

18. The apparatus of the claim 12, wherein the controller inversely and linearly transforms the first candidate parameter.

19. The apparatus of the claim 12, wherein the controller updates the matrix information by using the measurement spectrum.

20. The apparatus of the claim 12, wherein the hypothesized parameter distribution is probabilistic statistics data of a plurality of parameters obtained by repeatedly performing obtaining the measurement spectrum, sampling the first candidate parameter vector, linearly transforming the first candidate parameter vector, determining the first candidate parameter, determining the second candidate parameter vector, determining the second candidate parameter, and updating the first candidate parameter by a batch unit, and includes a multivariate normal distribution.

* * * * *